United States Patent
Hosoi et al.

(10) Patent No.: US 6,946,167 B2
(45) Date of Patent: Sep. 20, 2005

(54) DEPOSITED FILM FORMING APPARATUS AND DEPOSITED FILM FORMING METHOD

(75) Inventors: Kazuto Hosoi, Nara (JP); Toshiyasu Shirasuna, Nara (JP); Kazuhiko Takada, Nara (JP); Ryuji Okamura, Kyoto (JP); Kazuyoshi Akiyama, Nara (JP); Hitoshi Murayama, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/691,514

(22) Filed: Oct. 24, 2003

(65) Prior Publication Data

US 2004/0083974 A1 May 6, 2004

Related U.S. Application Data

(62) Division of application No. 10/046,318, filed on Jan. 16, 2002, now Pat. No. 6,702,898, which is a division of application No. 09/219,724, filed on Dec. 23, 1998, now Pat. No. 6,347,601.

(30) Foreign Application Priority Data

Dec. 26, 1997 (JP) .............................................. 9-369547

(51) Int. Cl.$^7$ .............................................. C23C 16/00
(52) U.S. Cl. .................................. 427/569; 118/723 E
(58) Field of Search .................................. 427/569, 580, 427/585; 118/723 E; 156/345.43, 345.44, 345.45, 345.46, 345.47

(56) References Cited

U.S. PATENT DOCUMENTS

| 4,867,859 | A | 9/1989 | Harada et al. ........ 118/723 ER |
|---|---|---|---|
| 5,522,936 | A | 6/1996 | Tamura ................... 118/723 R |
| 5,534,070 | A | 7/1996 | Okamura et al. ......... 118/723 E |
| 5,540,781 | A | 7/1996 | Yamagami et al. ....... 118/723 E |
| 5,556,500 | A | 9/1996 | Hasegawa et al. ..... 156/345.27 |
| 5,651,867 | A | 7/1997 | Kokaku et al. ............. 118/729 |
| 5,688,330 | A | 11/1997 | Ohmi ....................... 118/723 E |
| 5,919,332 | A | 7/1999 | Koshiishi et al. ....... 136/345.47 |
| 5,958,265 | A | 9/1999 | Ogahara ..................... 118/725 |
| 5,970,907 | A | 10/1999 | Takai et al. .............. 118/723 E |
| 6,098,568 | A | 8/2000 | Raoux et al. ............ 118/723 E |

FOREIGN PATENT DOCUMENTS

JP          01-047019          2/1989 ......... H01L/21/205

*Primary Examiner*—Gregory Mills
*Assistant Examiner*—Michelle Crowell
(74) *Attorney, Agent, or Firm*—Fitzpatrick, Cella, Harper & Scinto

(57) ABSTRACT

For enhancing plasma uniformity and long-term stability so as to readily form a film with excellent uniformity of thickness and quality and with good repeatability and for suppressing occurrence of image defects and drastically increasing the yield to form a deposited film ready for volume production, particularly, a functional deposit film (for example, an amorphous semiconductor used for semiconductor devices, electrophotographic photosensitive members, photovoltaic devices, and so on) is formed in an apparatus including a reaction vessel which can be hermetically evacuated, a substrate holder in the reaction vessel, a source gas supply, a power supply for high-frequency power. An end covering member is provided at an end of each of the substrate holder, the source gas supply and the power supply.

3 Claims, 6 Drawing Sheets

DEPOSITED FILM FORMING APPARATUS AND DEPOSITED FILM FORMING METHOD

This application is a division of application Ser. No. 10/046,318, filed Jan. 16, 2002 now U.S. Pat. No. 6,702,898, which in turn, is a division of application Ser. No. 09/219,724, filed Dec. 23, 1998 now U.S. Pat. No. 6,347,601.

BACKGROUND OF THE INVENTION

1. Field of the Invention

The present invention relates to a deposited film forming apparatus (a plasma CVD apparatus etc.) and a deposited film forming method for forming a deposited film, particularly a functional deposited film (for example, an amorphous semiconductor used for semiconductor devices, electrophotographic photosensitive members, photovoltaic devices, and so on) or the like, on a substrate.

2. Related Background Art

Suggested as device materials used for the semiconductor devices, electrophotographic photosensitive members, photovoltaic devices, and various other electronic devices are non-monocrystalline deposited films such as amorphous silicon, for example, typified by amorphous silicon compensated by hydrogen or/and halogen (for example, fluorine, chlorine, etc.) (which will hereinafter be abbreviated as "a—Si:H,X"), or crystalline deposited films such as thin films of diamond, and some of them are used in practice. These deposited films are formed, for example, by the plasma CVD method, i.e., by a method for decomposing a source gas by a glow discharge induced by direct current, high-frequency wave, or microwave and forming a deposited film on such a substrate as glass, quartz, a heat-resistant synthetic resin film, stainless steel, or aluminum, and a variety of devices for carrying out the method are also suggested.

An example of such a forming apparatus and forming method of deposited film is one briefly described below.

FIG. 1A and FIG. 1B are schematic structural diagrams to show an example of an apparatus for producing an electrophotographic photosensitive member by the high-frequency plasma CVD method. The structure of the production apparatus illustrated in FIGS. 1A and 1B is as follows.

This apparatus is generally composed of a deposition system 1100, a source gas supply system 1200, and an exhaust system (not illustrated) for reducing the pressure inside a reaction vessel 1111. Inside the reaction vessel 1111 in the deposition system 1100 there are cylindrical substrates 1112, heaters 1114 for heating the respective substrates, source gas inlet pipes 1115, and a cathode electrode 1116, and a high-frequency power supply 1117 and a high-frequency matching box 1118 are connected to the cathode electrode 1116.

The source gas supply system 1200 has cylinders 1221 to 1226 for supplying respective source gases of $SiH_4$, $GeH_4$, $H_2$, $CH_4$, $B_2H_6$, $PH_3$, etc., valves 1231 to 1236, and mass flow controllers 1211 to 1216, and the cylinder of each source gas is connected via an auxiliary valve 1260 to the gas inlet pipes 1115 in the reaction vessel 1111.

Formation of a deposited film using the deposited film forming apparatus described above is carried out, for example, as described below.

First, cylindrical substrates 1112 as substrates for forming the deposited film thereon are set in the reaction vessel 1111 by use of substrate holding means 1113 and the inside of the reaction vessel 1111 is evacuated by the unrepresented exhaust device (for example, a vacuum pump). Subsequently, the temperature of the cylindrical substrates 1112 is set to a predetermined temperature in the range of 200 to 450° C. by the heaters 1114 for heating the respective substrates.

For letting the source gases for formation of the deposited film into the reaction vessel 1111, after confirming that the valves 1231 to 1236 of the gas cylinders are closed and that the inflow valves 1241 to 1246, outflow valves 1251 to 1256, and auxiliary valve 1260 are opened, an exhaust valve (not illustrated) is first opened to evacuate the inside of the reaction vessel 1111 and the gas pipe 1119.

When the vacuum gauge (not illustrated) reaches about $6.7 \times 10^{-4}$ Pa, the auxiliary valve 1260 and outflow valves 1251 to 1256 are closed. Thereafter, the cylinder valve 1231 to 1236 are opened to introduce each gas from the corresponding gas cylinder 1221 to 1226 and the pressure of each gas is adjusted to about 2 kg/cm² by pressure regulator 1261 to 1266. Then the inflow valve 1241 to 1246 are gradually opened to introduce each gas into the mass flow controller 1211 to 1216.

After completion of the preparation for film formation as described above, formation of each layer is carried out according to the following procedures. When the cylindrical substrates 1112 reach a predetermined temperature, necessary valves out of the outflow valves 1251 to 1256, and the auxiliary valve 1260 are gradually opened to introduce predetermined gases from the corresponding gas cylinders 1221 to 1226 through the gas inlet pipe 1115 into the reaction vessel 1111. Then each source gas is adjusted to a predetermined flow rate by the corresponding mass flow controller 1211 to 1216. On that occasion, the aperture of the exhaust valve (not illustrated) is adjusted with observing the vacuum gauge (not illustrated) so that the pressure inside the reaction vessel 1111 is not more than $1.3 \times 10^2$ Pa. When the internal pressure becomes stable, the high-frequency power supply 1117, for example, of the frequency 13.56 MHz is set to a desired power and the high-frequency power is supplied via the high-frequency matching box 1118 and cathode electrode 1116 into the reaction vessel 1111, thereby inducing the glow discharge. The source gases introduced into the reaction vessel 1111 are decomposed by this discharge energy to form a predetermined deposited film having the matrix of silicon on the cylindrical substrates 1112. After the film is formed in a desired thickness, the supply of the high-frequency power is stopped and the outflow valves are closed to stop the flow of the gases into the reaction vessel 1111, thereby completing the formation of the deposited film.

A photosensitive layer can be formed in a multilayer structure by repeating the above-described operation.

Multiple layers may be formed continuously to gradually change the high-frequency power, gas flow rates, and pressure to their set values for the next layer in a fixed time after completion of formation of one layer.

It is needless to mention that all the outflow valves other than those for necessary gases are closed during the formation of each layer. In addition, an operation for closing the outflow valves 1251 to 1256, opening the auxiliary valve 1260, and fully opening the exhaust valve (not illustrated) to evacuate the inside of the system once to a high vacuum is carried out as needed in order to prevent the gases from remaining inside the reaction vessel 1111 and inside the pipe from the outflow valves 1251 to 1256 to the reaction vessel 1111. During the formation of the deposited film, a motor 1120 is driven to rotate a rotational shaft 1122 via gears 1121 and in turn rotate each cylindrical substrate 1112, whereby the deposited film is formed throughout the entire circumference of the surface of each cylindrical substrate 1112.

Although good a-Si base electrophotographic photosensitive members are formed by the above-stated apparatus and method, the above apparatus and method require further improvement in order to enhance the overall characteristics.

Particularly, the increase in the speed of the electrophotographic apparatus is advancing rapidly and there are demands for further enhancement of electrical characteristics of the electrophotographic photosensitive members.

As the performance of the main body of copiers is rapidly improving and as digital copiers and color copiers have spread in recent years, the electrophotographic photosensitive members are required to implement further enhancement of image characteristics such as higher quality of image or higher quality of product than heretofore.

Further, as the size of copying machines is decreasing and as the demand for light receiving members such as printers is increasing, the demand for the electrophotographic photosensitive members of smaller diameters is also increasing. Development is needed of a production apparatus that can adapt to the decrease in size.

Under such circumstances, the technology that allows to maintain the uniformity of plasma, long-term stability, and uniformity of film thickness and film quality with good repeatability is strongly demanded in the field of producing electrophotographic photosensitive members in order to achieve the above needs.

Further, it also becomes necessary to eliminate small image defects which were insignificant heretofore. The principal cause of the image defects is in that the deposited film peels off and scatters onto the substrate resulting in abnormal growth. It is thus necessary to prevent pieces of the film, which will cause image defects, from peeling onto the substrate.

SUMMARY OF THE INVENTION

In order to solve the issues described above, an object of the present invention is to provide a deposited film forming apparatus and a deposited film forming method for forming a deposited film, particularly a functional deposited film (for example, an amorphous semiconductor used for the semiconductor devices, electrophotographic photosensitive members, photovoltaic devices, and so on) or the like, by readily forming the deposited film improved in the plasma uniformity and long-term stability and excellent in the uniformity of thickness and quality of film with good repeatability, decreasing the amount of image defects, and drastically improving the yield so as to permit mass production.

According to an aspect of the present invention, there is provided a deposited film forming apparatus comprising a reaction vessel capable of hermetic evacuation, a holding member for holding a substrate in the vacuum vessel, a source gas supply means for supplying a source gas, and a power supply means for introducing a high-frequency power, the apparatus comprising an end covering member provided at an end portion of each of the substrate holding member, the source gas supply means, and the power supply means.

According to another aspect of the present invention, there is provided a deposited film forming method which uses a reaction vessel capable of hermetic evacuation, a holding member for holding a substrate in the reaction vessel, a source gas supply means for supplying a source gas, and a power supply means for introducing a high-frequency power, the method comprising inducing a glow discharge by the high-frequency power to decompose the source gas introduced into the reaction vessel, thereby forming a deposited film on a substrate held by the substrate holding member, wherein the deposited film is formed with an end portion of each of the substrate holding member, the source gas supply means, and the power supply means being placed outside an area of the glow discharge.

According to still another aspect of the present invention, there is provided a deposited film forming apparatus comprising a reaction vessel capable of hermetic evacuation, a holding member for holding a substrate in the reaction vessel, a source gas supply means for supplying a source gas, and a power supply means for introducing a high-frequency power, wherein an end portion of each of the substrate holding member, the source gas supply means, and the power supply means is placed outside an area of a glow discharge.

DESCRIPTION OF THE PREFERRED EMBODIMENTS

The inventors have studied intensively and extensively in order to achieve the above objects of the present invention while overcoming the above-stated issues in the deposited film forming apparatus. As a result, they have found that the plasma uniformity and long-term stability could be enhanced, the thickness and quality of deposited film could become uniform, and the image defects could be eliminated, by placing an end portion of each of the source gas inlet pipes, the cathode electrode for supplying the high-frequency power, and the holding members for holding the cylindrical substrates outside the glow discharge inducing area.

In the present invention, the end portions can be placed outside the glow discharge inducing area by providing an end covering member at the end portions of the source gas inlet pipes, the cathode electrode for supplying the high-frequency power, and the holding members for holding the cylindrical substrates, so that the plasma is prevented from concentrating at the end portions during film deposition to prevent abnormal discharge from the end portions. Therefore, the plasma uniformity and long-term stability are enhanced, and the deposited film with uniform thickness and quality can be formed with good repeatability.

Further, the structure of the present invention is such that an end portion of each of the source gas supply pipes, the electrode for supplying the high-frequency power, and the holding members for holding the cylindrical substrates are located outside the glow discharge space area, whereby peeling of a film from the edge of each end portion, which will be the cause of image defects, can be prevented to eliminate image defects. Therefore, the present invention is effective in improving the quality of a copy image.

The present invention will be described in detail with reference to the drawings.

Figure 2A:
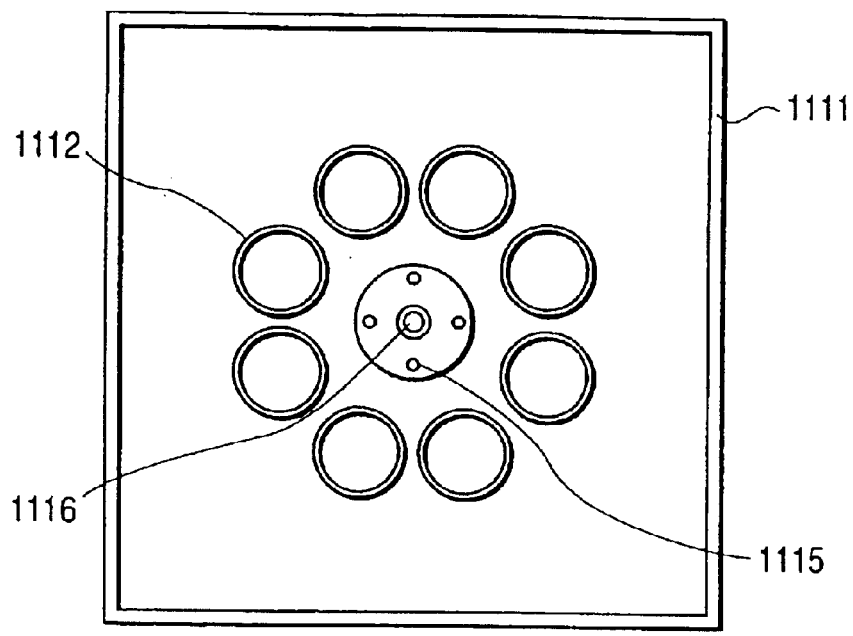
FIG. 2A and FIG. 2B are schematic, sectional, structural views for explaining another example of the deposited film forming apparatus.
Figure 2B:
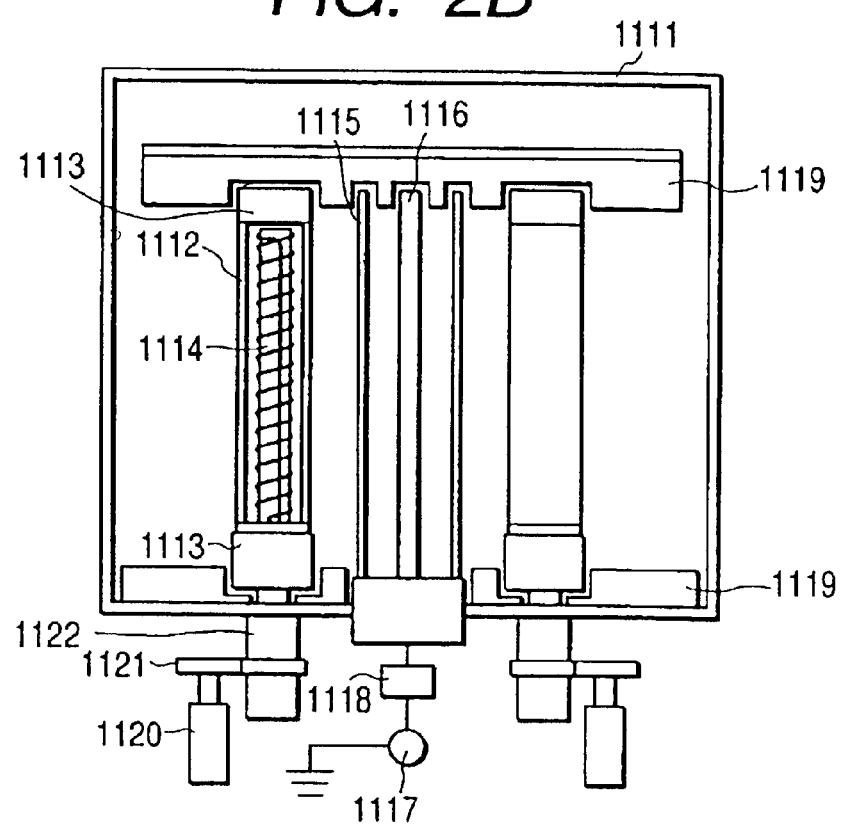

FIG. 2A is a lateral sectional view to schematically show a deposited film forming apparatus according to the present invention and FIG. 2B is a longitudinal sectional view to schematically show the deposited film forming apparatus of the present invention. The apparatus illustrated in FIGS. 2A and 2B is provided with a rotation driving mechanism for holding a lower end portion of each substrate 1112 on which a deposited film is to be formed, such as a cylindrical substrate, and for rotating the substrate about the axis of each cylinder. In FIGS. 2A and 2B the gas supply system for supplying the source gas is omitted from illustration. The rotation driving mechanism is comprised of a mechanism for rotating a rotational shaft 1122 linked to each cylindrical substrate 1112 via gears 1121 by a rotating motor 1120. These cylindrical substrates 1112 are located on a common circumference around the cathode electrode in the reaction vessel 1111 that can be evacuated and the source gas is decomposed in the space surrounded by the cylindrical substrates, whereby gas utilization efficiency can be increased.

Further, this apparatus is constructed such that end covering members 1119 are placed for locating all the end portions of the gas inlet pipes 1115, the cathode electrode 1116, and the holding members 1113 of the cylindrical substrates outside the glow discharge inducing area. This prevents the abnormal discharge and film peeling from these end portions, so that good deposited films with uniform thickness and quality can be effectively produced.

In the present invention there are no specific restrictions on the shape and size of the end covering members 1119 as long as the end covering members 1119 can cover the end portions of all the gas inlet pipes 1115, the cathode electrode 1116, and the holding members 1113 of cylindrical substrates to keep them outside the glow discharge inducing area and permit rotation of the holding members of the cylindrical substrates.

However, a gap between each end covering member and each element is preferably in the range of 1 mm to 5 mm in order to prevent glow discharge from occurring between each end portion of the gas inlet pipes 1115, the cathode electrode 1116, and the holding members 1113 of cylindrical substrates, and the end covering members 1119.

There are no specific restrictions on the material for the end covering members. The end covering members 1119 can be made of any material that has a sufficient mechanical strength and can withstand the operating conditions, including the temperature, plasma, and so on. For example, generally applicable materials include metals such as stainless steel, Al, Ti, Cr, Fe, Ni, and Co, ceramics typified by $Al_2O_3$, and so on. It is also effective to carry out ceramic spraying, surface roughening, etc. on the surfaces of the end covering members on the discharge inducing area side in order to enhance adhesion of deposited films. Specifically, the treatment is conducted so that the surface roughness (Rz) falls preferably in the range of 20 $\mu$m to 70 $\mu$m.

Next is a description of an example of a method for forming a deposited film on cylindrical substrates by use of the apparatus described above.

First, in the reaction vessel 1111, a plurality of cylindrical substrates 1112 preliminarily degreased and cleaned are set on the common circumference around the cathode electrode 1116 by the holding members 1113 of cylindrical substrates, all the end portions of the gas inlet pipes, the cathode electrode, and the holding members of cylindrical substrates are covered by the end covering members 1119 so as to place each end portion outside the glow discharge inducing area, and the reaction vessel 1111 is evacuated through an exhaust pipe by the unrepresented exhaust device (for example, a vacuum pump). Then the cylindrical substrates 1112 are heated and set to a desired temperature by heaters 1114.

When the cylindrical substrates 12 reach the desired temperature, the source gas is introduced from the source gas supply system (not illustrated) through the gas inlet pipes 1115 into the reaction vessel 1111. At this time care is taken to avoid extreme pressure variation such as a sudden rush of gas.

When the flow rate of the source gas reaches a set value, the exhaust valve (not illustrated) is adjusted with observing a vacuum gauge (not illustrated) to obtain a desired internal pressure.

After confirming that the internal pressure is stable, the cylindrical substrates 1112 are rotated by the rotation driving mechanism 1120 to 1122 and the predetermined high-frequency power is supplied from the high-frequency power supply 1117 via the high-frequency matching box 1118 to the cathode electrode 1116. This discharge energy of the high-frequency power supply 1117 decomposes the source gas introduced into the reaction vessel 1111 to form a deposited film on the cylindrical substrates 1112. The cylindrical substrates 1112 are rotated, thereby permitting the desired deposited film to be formed throughout the entire circumference of each cylindrical substrate.

After completion of the formation of the deposited films in the desired thickness, the supply of the high-frequency power is stopped and then the flow of the gas into the reaction vessel 1111 is also stopped. When deposited films are formed in multilayer structure on the substrates in order to obtain the desired characteristics, the above operation is repeated multiple times.

For a transition between two layers, a method may be applied such that the discharge is completely stopped once the layer described above completely forms, and the setting of the gas flow rates and pressure is changed for the next layer, and thereafter discharge is again induced to effect formation of the next layer. Another method may be applied such that multiple layers are continuously formed while the gas flow rates, pressure, and high-frequency power are gradually changed to set values for the next layer during a fixed period after completion of formation of one layer.

In the present invention, where all the end portions of the gas inlet pipes, the cathode electrode, and the holding members of cylindrical substrates are placed outside the glow discharge inducing area by the end covering members, it is further preferable to make the end covering members detachable from the reaction vessel. This can increase the maintenance efficiency, improve productivity, and enhance reproducibility of deposited film in mass production.

In the present invention there are no specific restrictions on the frequency of the high-frequency power introduced into the reaction vessel. According to the experiments conducted by the inventors, however, there were some cases in which with the frequencies of not more than 50 MHz the discharge became instable depending upon conditions and the forming conditions of deposited film where the number of set substrates was increased and the volume of the film-forming space was increased to thus expand the spread of discharge in order to increase production efficiency. It was also found that with the frequencies over 450 MHz the transmission characteristics of the high-frequency power were degraded and there were some cases in which it was difficult to induce the glow discharge itself. According to the knowledge of the inventors, including the above points, it is preferable to use an electromagnetic wave with the high-frequency power in the range of 50 MHz to 450 MHz to better mass produce deposited films using the production apparatus of the present invention.

The layer structures of a-Si base electrophotographic photosensitive members, which can be produced by the present invention described above, are, for example, described below.

Figure 3:
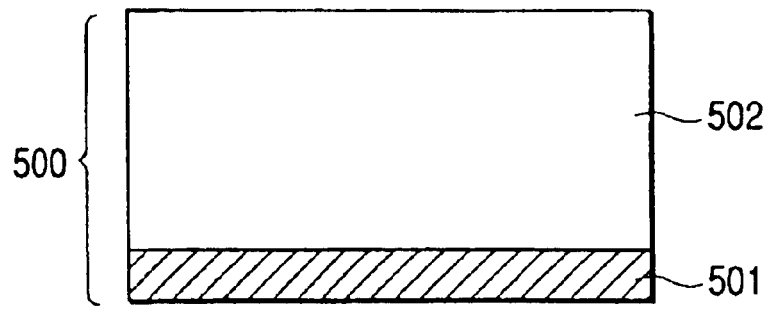
FIG. 3 is a schematic, sectional view for explaining an example of the electrophotographic photosensitive member.
Figure 4:
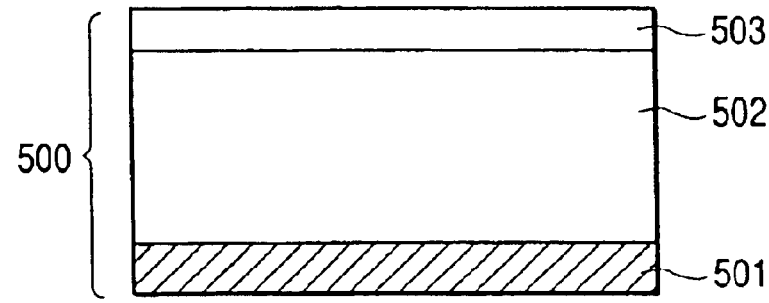
FIG. 4 is a schematic, sectional view for explaining another example of the electrophotographic photosensitive member.
Figure 5:
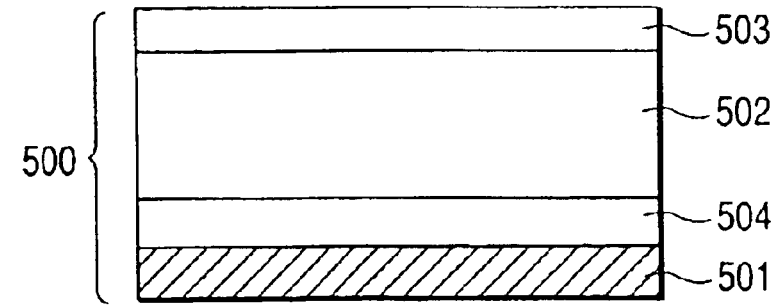
FIG. 5 is a schematic, sectional view for explaining another example of the electrophotographic photosensitive member.

FIGS. 3 to 5 are schematic structural views for explaining examples of layer structures of a-Si base electrophotographic photosensitive members 500.

The electrophotographic photosensitive member 500 illustrated in FIG. 3 has a photoconductive layer 502 with a photoconductive property made of a-Si:H,X on a cylindrical substrate 501.

The electrophotographic photosensitive member 500 illustrated in FIG. 4 has the photoconductive layer 502 with the photoconductive property comprised of a-Si:H,X, and an amorphous silicon base surface layer 503 on the cylindrical substrate 501.

The electrophotographic photosensitive member 500 illustrated in FIG. 5 has the photoconductive layer 502 with the photoconductive property comprised of a-Si:H,X, the amorphous silicon base surface layer 503, and an amorphous silicon base charge injection inhibiting layer 504 on the cylindrical substrate 501.

The substrates used in the present invention can be any substrates that are electrically conductive. Examples of materials for the cylindrical substrates include metals such as Al, Cr, Mo, In, Nb, Te, V, Ti, Pt, Pd, Fe, etc., and alloys of these metals (for example, stainless steel etc.). The substrates can also be cylindrical substrates obtained by an electric conduction treatment of at least the film-deposited-side surface of electrically insulating, cylindrical substrates such as sheets of synthetic resins such as polyester, polyethylene, polycarbonate, cellulose acetate, polypropylene, polyvinyl chloride, polystyrene, and polyamide, glass, ceramics, and so on. In this case, it is further desirable to perform the electrical conduction treatment on the opposite side to the film-deposited side as well.

Describing the photoconductive layer used in the present invention referring to FIG. 3, the photoconductive layer 502 is formed on the cylindrical substrate 501 while film-forming parameters are properly set so as to achieve desired characteristics. In formation of the photoconductive layer 502, a source gas capable of supplying silicon atoms (Si), and a source gas capable of supplying hydrogen atoms (H) and/or a source gas for supplying halogen atoms (X) are introduced in a gas state into the reaction vessel the inside of which can be depressurized. Glow discharge is induced in the reaction vessel, whereby a layer comprised of a-Si:H,X is deposited on the predetermined cylindrical substrate 501 preliminarily set at a predetermined position.

The photoconductive layer 502 needs to contain hydrogen atoms and/or halogen atoms, which are necessary and indispensable for compensating for dangling bonds of silicon atoms to improve the quality of a layer, particularly, for enhancing the photoconductive property and charge holding characteristics. The content of hydrogen atoms or halogen atoms, or the total amount of hydrogen atoms and halogen atoms is preferably 10 to 40 atomic % and more preferably 15 to 25 atomic % over the sum of silicon atoms and hydrogen atoms and/or halogen atoms.

Substances that can be the Si-supplying gases are gaseous or gasifiable silicon hydrides (silanes) such as $SiH_4$, $Si_2H_6$, $Si_3H_8$, $Si_4H_{10}$, etc., which can be used effectively in the present invention. Preferred materials are $SiH_4$ and $Si_2H_6$ in terms of ease to handle during formation of a layer, high Si supply efficiency, and so on.

It is also effective to form the layer by further mixing a desired amount of $H_2$ and/or an inert gas such as He, Ar, or Ne, or a gas of a silicon compound containing hydrogen atoms into the above-stated gases in order to structurally introduce hydrogen atoms into the photoconductive layer 502 to be formed, further facilitate control of the ratio of hydrogen atoms introduced, and obtain desired film characteristics. Each gas need not be only a single species, but can also be a mixture of several species at a predetermined mixture ratio.

Preferred examples of materials effectively used as the source gas for supply of halogen atoms include gaseous or gasifiable halogen compounds such as halogen gases, halides, interhalogen compounds containing a halogen, silane derivatives substituted by a halogen, and so on. In addition, other materials effectively used are gaseous or gasifiable silicon halide, hydrogenated silicon compounds containing halogen atoms. The halogen compounds that can be particularly preferable are fluorine gas ($F_2$), and the interhalogen compounds such as BrF, $ClF_3$, $BrF_3$, $BrF_5$, $IF_3$, $IF_7$, etc. Preferred examples of the silicon compounds containing halogen atoms, which are called silane derivatives substituted by halogen atoms, are silicon fluorides, for example, $SiF_4$ and $Si_2F_6$.

The amount of the hydrogen atoms and/or halogen atoms contained in the photoconductive layer 502 can be controlled, for example, by controlling the temperature of the cylindrical substrate 501, the amount of the raw material for inclusion of hydrogen atoms and/or halogen atoms introduced into the reaction vessel, the discharge power, and so on.

It is preferable to make the photoconductive layer 502 contain atoms for controlling the conductivity type as needed. The atoms for controlling the conductivity type may be uniformly distributed throughout the photoconductive layer 502 or may be nonuniformly distributed in part in the direction of the layer thickness. Examples of the atoms for controlling the conductivity type are so-called impurities in the semiconductor field and they can be selected from the atoms belonging to Group IIIb of the periodic table to provide the p-type conductivity (hereinafter abbreviated as "IIIb atoms") or the atoms belonging to Group Vb of the periodic table to provide the n-type conduction property (hereinafter abbreviated as "Vb atoms"). Specific examples of the IIIb atoms include boron (B), aluminum (Al), gallium (Ga), indium (In), thallium (Tl), and so on, among which B, Al, and Ga are particularly suitable. Specific examples of the Vb atoms are phosphorus (P), arsenic (As), antimony (Sb), bismuth (Bi), and so on, among which P and As are particularly suitable.

The content of the atoms for controlling the conductivity type, contained in the photoconductive layer 502, is preferably $1\times10^{-2}$ to $1\times10^{4}$ atomic ppm, more preferably $5\times10^{-2}$ to $5\times10^{3}$ atomic ppm, and most preferably $1\times10^{-1}$ to $1\times10^{3}$ atomic ppm.

The atoms for controlling the conductive type, for example, the IIIb atoms or the Vb atoms, can be structurally introduced by introducing a raw material for introduction of the IIIb atoms or a raw material for introduction of the Vb atoms in a gas state, together with the other gases for formation of the photoconductive layer 502, into the reaction vessel during the formation of the layer. The raw material for introduction of the IIIb atoms or the raw material for introduction of the Vb atoms is desirably a gaseous material at ordinary temperature and ordinary pressure or a material that can be readily gasified at least under the film-forming conditions.

Specific examples of the raw material for introduction of the IIIb atoms, e.g. for introduction of boron atoms, include boron hydrides such as $B_2H_6$, $B_4H_{10}$, $B_5H_9$, $B_5H_{11}$, $B_6H_{10}$, $B_6H_{12}$, and $B_6H_{14}$, boron halides such as $BF_3$, $BCl_3$, and $BBr_4$, and so on. Further examples include $AlCl_3$, $GaCl_3$, $Ga(CH_3)_3$, $InCl_3$, $TlCl_3$, and so on.

Specific examples of the raw material effectively used for introduction of the Vb atoms, e.g. for introduction of phosphorus atoms, are phosphorus hydrides such as $PH_3$ and $P_2H_4$, phosphorus halides such as $PH_4I$, $PF_3$, $PF_5$, $PCl_3$, $PBr_3$, $PBr_5$, and $PI_3$, and so on. Further examples of the raw material that can be effectively used as a starting substance for introduction of the Vb atoms include $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, and so on.

These raw materials for introduction of the atoms for controlling the electroconductive property may be diluted with $H_2$ and/or an inert gas such as He if necessary.

The thickness of the photoconductive layer 502 is properly determined as needed for obtaining desired electrophotographic characteristics, economical effect, and so on, and is preferably 1 to 100 μm, more preferably 20 to 50 μm, and most preferably 23 to 45 μm.

For forming the photoconductive layer 502 with desired film characteristics, it is necessary to properly set a mixture ratio of the gas for supply of Si with a dilution gas, the pressure of the gas inside the reaction vessel, the discharge power, and the substrate temperature.

The optimum range of flow rate of $H_2$ and/or the inert gas such as He (the inlet gas will be represented hereinafter by He) used as a dilution gas is properly selected according to the design of the layer, and $H_2$ and/or He is controlled normally in the range of 1 to 20 times, preferably in the range of 4 to 15 times, and most preferably in the range of 5 to 10 times the gas for supply of Si. The optimum range of the gas pressure inside the reaction vessel is also properly selected according to the design of the layer and is normally $1.3\times10^{-3}$ to $1.3\times10^{3}$ Pa, preferably $6.6\times10^{-3}$ to $6.6\times10^{2}$ Pa, and most preferably $1.3\times10^{-2}$ to $1.3\times10^{2}$ Pa. The optimum range of the discharge power is also properly selected according to the design of the layer, and the discharge power per flow rate of the gas for supply of Si is set normally in the range of 1 to 100 W/sccm, preferably in the range of 2 to 80 W/sccm, and most preferably in the range of 3 to 50 W/sccm. The optimum range of the temperature of the substrate is also properly selected according to the design of the layer and a desirable range thereof is normally 200 to 350° C.

In the present invention, the above-stated ranges can be listed as preferred substrate temperature and gas pressure for formation of the photoconductive layer, but these conditions, normally, cannot be determined independent of each other. It is thus desirable to determine their optimum values, based on their relationship to form the electrophotographic photosensitive member with desired characteristics.

It is preferable to further form an amorphous silicon base surface layer on the photoconductive layer 502 formed on the substrate as described above. This surface layer 503 is provided mainly for the principal purpose of enhancing moisture resistance, continuous and repetitive operation characteristics, dielectric strength, operating environment characteristics, and durability.

The surface layer 503 can be comprised of any amorphous silicon base material, and examples of preferred materials therefor are amorphous silicon containing hydrogen atoms (H) and/or halogen atoms (X) and further containing carbon atoms (hereinafter referred to as "a-SiC:H,X"), amorphous silicon containing hydrogen atoms (H) and/or halogen atoms (X) and further containing oxygen atoms (hereinafter referred to as "a-SiO:H,X"), amorphous silicon containing hydrogen atoms (H) and/or halogen atoms (X) and further containing nitrogen atoms (hereinafter referred to as "a-SiN:H,X"), amorphous silicon containing hydrogen atoms (H) and/or halogen atoms (X) and further containing at least two of carbon, oxygen, and nitrogen (hereinafter referred to as "a-SiCON:H,X"), and so on.

The surface layer 503 is made by a vacuum deposited film forming method while the film-forming parameters are properly set so as to obtain desired characteristics.

For example, when the surface layer 503 is comprised of a-SiC:H,X, basically, the source gas capable of supplying silicon atoms (Si), the source gas capable of supplying carbon atoms (C), and the source gas capable of supplying hydrogen atoms (H) and/or the source gas capable of supplying halogen atoms (X) are introduced in a gas state into the reaction vessel the inside of which can be depressurized. The discharge is induced in the reaction vessel, whereby the layer of a-SiC:H,X is deposited on the substrate having the photoconductive layer 502 thereon, which is preliminarily set at a predetermined position.

The surface layer 503 can be comprised of any amorphous material containing silicon, but a preferred compound for the surface layer is one with silicon atoms containing at least one element selected from carbon, nitrogen, and oxygen. Further, a particularly preferred material is a compound the principal component of which is a-SiC.

When the surface layer 503 is comprised of a material having the matrix of a-SiC, the amount of carbon is preferably in the range of 30% to 90% over the sum of silicon atoms and carbon atoms.

The surface layer 503 needs to contain hydrogen atoms and/or halogen atoms, which are important for compensating for dangling bonds of silicon atoms and enhancing the quality of the layer, particularly, for enhancing the photoconductive property and charge retaining characteristics.

The hydrogen content is normally 30 to 70 atomic %, preferably 35 to 65 atomic %, and most preferably 40 to 60 atomic % over the total amount of the component atoms. The content of fluorine atoms is normally 0.01 to 15 atomic %, preferably 0.1 to 10 atomic %, and most preferably 0.6 to 4 atomic %.

Substances that can be effectively used as a gas for supply of silicon (Si) in formation of the surface layer 503 are gaseous or gasifiable silicon hydrides (silanes) such as $SiH_4$, $Si_2H_6$, $Si_3H_8$, and $Si_4H_{10}$, among which preferred substances are $SiH_4$ and $Si_2H_6$ in terms of ease to handle during production of the layer, high Si supply efficiency, and so on. These source gases for supply of Si can also be diluted with a gas such as $H_2$, He, Ar, or Ne if necessary.

Substances that can be effectively used as a gas for supply of carbon are gaseous or gasifiable hydrocarbons such as $CH_4$, $C_2H_6$, $C_3H_8$ and $C_4H_{10}$, among which preferred hydrocarbons are $CH_4$ and $C_2H_6$ in terms of ease to handle during production of the layer, high C supply efficiency, and so on. These source gases for supply of C can also be diluted with a gas such as $H_2$, He, Ar, or Ne if necessary.

Substances that can be effectively used as a gas for supply of nitrogen or oxygen are gaseous or gasifiable compounds such as $NH_3$, NO, $N_2O$, $NO_2$, CO, $CO_2$, and $N_2$. These source gases for supply of nitrogen or hydrogen can also be diluted with a gas such as $H_2$, He, Ar, or Ne if necessary.

For further facilitating the control of the introduction ratio of hydrogen atoms introduced into the surface layer 503 to be formed, it is preferable to form the layer by further mixing a desired amount of hydrogen gas or a gas of a silicon compound containing hydrogen atoms with these gases. Each gas may not be only a single species but may also be a mixture of several species at a predetermined mixture ratio.

Preferred examples effectively used as the source gas for supply of halogen atoms include gaseous or gasifiable halogen compounds such as halogen gases, halogenides, interhalogen compounds containing halogen, silane derivatives substituted by halogen, and so on. In addition, other materials effectively used are gaseous or gasifiable, silicon hydride compounds containing halogen atoms, components of which are silicon atoms and halogen atoms. Specifically, the halogen compounds that can be preferably used in the present invention are fluorine gas ($F_2$), and the interhalogen compounds such as BrF, ClF, $ClF_3$, $BrF_3$, $BrF_5$, $IF_3$, and $IF_7$. Preferred examples of the silicon compounds containing halogen atoms, which are called silane derivatives substituted by halogen atoms, are, specifically, silicon fluorides, for example, $SiF_4$ and $Si_2F_6$.

The amount of the hydrogen atoms and/or halogen atoms contained in the surface layer 503 can be controlled, for example, by controlling the temperature of the substrate, the amount of the raw material for inclusion of hydrogen atoms and/or halogen atoms introduced into the reaction vessel, the discharge power, and so on.

The carbon atoms and/or oxygen atoms and/or nitrogen atoms may be uniformly distributed throughout the surface layer 503 or may be nonuniformly distributed in part with varying contents in the direction of the thickness of the surface layer 503.

It is preferable to make the surface layer 503 contain the atoms for controlling the conductivity type as needed. The atoms for controlling the conductivity type may be uniformly distributed throughout the surface layer 503 or may be nonuniformly distributed in part in the direction of thickness.

Examples of the atoms for controlling the conductivity type are so-called impurities in the semiconductor field and they can be selected from the atoms belonging to Group IIIb of the periodic table to provide the p-type conductivity (hereinafter abbreviated as "IIIb atoms") or the atoms belonging to Group Vb of the periodic table to provide the n-type conductivity (hereinafter abbreviated as "Vb atoms"). Specific examples of the IIIb atoms include boron (B), aluminum (Al), gallium (Ga), indium (In), thallium (Tl), and so on, among which B, Al, and Ga are particularly suitable. Specific examples of the Vb atoms are phosphorus (P), arsenic (As), antimony (Sb), bismuth (Bi), and so on, among which P and As are particularly suitable.

The content of the atoms for controlling the electroconductive property, contained in the surface layer 503, is preferably $1\times10^{-3}$ to $1\times10^3$ atomic ppm, more preferably $1\times10^{-2}$ to $5\times10^2$ atomic ppm, and most preferably $1\times10^{-1}$ to $1\times10^2$ atomic ppm. The atoms for controlling the conductivity type, for example, the IIIb atoms or the Vb atoms, can be structurally introduced by introducing the raw material for introduction of the IIIb atoms or the raw material for introduction of the Vb atoms in a gas state, together with the other gases for formation of the surface layer 503, into the reaction vessel during the formation of the layer.

The raw material for introduction of the IIIb atoms or the raw material for introduction of the Vb atoms can be suitably selected from those for the photoconductive layer described above.

The thickness of the surface layer 503 is normally 0.01 to 3 $\mu$m, preferably 0.05 to 2 $\mu$m, and most preferably 0.1 to 1 $\mu$m. If the thickness of the layer is smaller than 0.01 $\mu$m the surface layer 503 will be lost due to wear or the like during use of the light receiving member. If the thickness is over 3 $\mu$m degradation of electrophotographic characteristics will occur, such as increase of residual potential.

The surface layer 503 is carefully formed so as to achieve its required characteristics. Specifically, the substances whose components are Si, at least one selected from C, N, and O, and H and/or X, can structurally take any morphology from crystal to amorphism, electro-physically demonstrate properties ranging from the electroconductive property to the semiconductive property and electrically insulating property and also demonstrate properties from the photoconductive property to the non-photoconductive property, depending upon their forming conditions. In the present invention, therefore, the forming conditions of the surface layer are precisely selected as needed to form a compound having desired characteristics according to a specific purpose.

For example, when the surface layer 503 is provided for the principal purpose of improving the dielectric strength, it is comprised of a non-monocrystalline material exhibiting prominent, electrically insulating behavior in the operating condition.

When the surface layer is provided for the principal purpose of improving the continuous and repetitive operating characteristics and the operating condition characteristics, it is comprised of a non-monocrystalline material having some sensitivity to light radiated while the degree of the aforementioned electrically insulating property is not critical.

For forming the surface layer 503 with characteristics to accomplish a specific purpose, it is necessary to properly set the temperature of the substrate and the pressure of the gas in the reaction vessel as needed.

The optimum range of the temperature (Ts) of the substrate is properly selected according to the design of the layer and, normally, preferably 200 to 350° C., more preferably 230 to 330° C., and most preferably 250 to 300° C.

The optimum range of the gas pressure in the reaction vessel is also properly selected according to the design of the layer and, normally, preferably $1.3 \times 10^{-2}$ to $1.3 \times 10^3$ Pa, more preferably $6.7 \times 10^{-2}$ to $6.7 \times 10^2$ Pa, and most preferably $1.3 \times 10^{-1}$ to $1.3 \times 10^2$ Pa.

The desired numerical ranges of the substrate temperature and gas pressure for forming the surface layer 503 are the aforementioned ranges, but the conditions, normally, cannot be determined independent of each other. It is desirable to determine the optimum values, based on their relationship so as to form the photosensitive member with the desired characteristics.

It may also be contemplated that a region with continuously decreasing contents of carbon atoms and/or oxygen atoms and/or nitrogen atoms toward the photoconductive layer 502 is provided between the surface layer 503 and the photoconductive layer 502. This can enhance the adhesion between the surface layer 503 and the photoconductive layer 502, can relieve influence of interference due to reflection of light at the interface, and can also prevent trapping of carriers at the interface, thereby improving the characteristics of the photosensitive member.

The charge injection inhibiting layer 504, which functions to inhibit charge from being injected from the cylindrical substrate 501, may also be provided between the cylindrical substrate 501 and the photoconductive layer 502 as occasion may demand.

More specifically, the charge injection inhibiting layer 504 has the function to inhibit charge from being injected from the cylindrical substrate 501 into the photoconductive layer 502 when the photosensitive member is charged in a fixed polarity in the surface; but the inhibiting layer 504 does not inhibit change when the photosensitive member is charged in the opposite polarity. Therefore, the inhibiting layer has the so-called polarity dependence. For providing the inhibiting layer with such ability, the charge injection inhibiting layer 504 contains a relatively larger amount of the atoms for controlling the conductivity type than the photoconductive layer 502.

The atoms for controlling the conductivity, contained in the inhibiting layer, may be uniformly distributed throughout the layer or may be nonuniformly distributed in part, though contained throughout the layer, in the direction of the thickness. In the case of the nonuniform concentration distribution, it is preferable to distribute more atoms on the substrate side. In either case, it is, however, necessary to distribute the atoms uniformly throughout the layer in the in-plane directions parallel to the surface of the substrate in order to have uniform characteristics in the in-plane directions. The atoms for controlling the conductivity type, contained in the charge injection inhibiting layer 504, can be the so-called impurities in the semiconductor field.

The atoms for controlling the conductivity type can be selected from the atoms belonging to Group IIIb of the periodic table to provide the p-type conductivity (hereinafter abbreviated as "IIIb atoms") or the atoms belonging to Group Vb of the periodic table to provide the n-type conductivity (hereinafter abbreviated as "Vb atoms"). Specific elements that can be used herein are the same as those for the photoconductive layer.

The content of the atoms for controlling the conductivity type, contained in the charge injection inhibiting layer, is properly determined as occasion may demand, and is preferably 10 to $1 \times 10^4$ atomic ppm, more preferably 50 to $5 \times 10^3$ atomic ppm, and most preferably $1 \times 10^2$ to $1 \times 10^3$ atomic ppm.

Further, the charge injection inhibiting layer 504 is allowed to contain at least one of carbon, nitrogen, and oxygen, whereby the adhesion is further enhanced between the charge injection inhibiting layer 504 and the other layers provided in direct contact therewith.

The carbon atoms or nitrogen atoms or oxygen atoms contained in the inhibiting layer may be uniformly distributed throughout the layer or may be nonuniformly distributed in part, though contained throughout the layer, in the direction of the thickness. In either case, it is, however, necessary to distribute the atoms uniformly throughout the layer in the in-plane directions parallel to the surface of the substrate, in order to have uniform characteristics in the in-plane directions.

The content of the atoms selected from the carbon atoms, nitrogen atoms, and oxygen atoms, contained in the entire region of the charge injection inhibiting layer 504, is properly determined so as to effectively accomplish the objects of the present invention, but the content, which is, in the case of one kind, the amount thereof or which is, in the case of two or more kinds, the sum thereof, is preferably $1 \times 10^{-3}$ to 50 atomic %, more preferably $5 \times 10^{-3}$ to 30 atomic %, and most preferably $1 \times 10^{-2}$ to 10 atomic %.

The hydrogen atoms and/or halogen atoms contained in the charge injection inhibiting layer 504 have the effect of compensating for dangling bonds existing in the layer to improve the quality of film. The content of hydrogen atoms or halogen atoms or the total amount of hydrogen atoms and halogen atoms in the charge injection inhibiting layer 504 is preferably 1 to 50 atomic %, more preferably 5 to 50 atomic %, and most preferably 10 to 30 atomic %.

The thickness of the charge injection inhibiting layer 504 is preferably 0.5 to 5 $\mu$m, more preferably 0.3 to 4 $\mu$m, and most preferably 0.5 to 3 $\mu$m, from the aspect of achieving desired electrophotographic characteristics, economical effect, and so on.

For formation of the charge injection inhibiting layer 504, there is adopted a vacuum deposition method similar to the method for forming the photoconductive layer 502 as described above. Just as in the case with the photoconductive layer, it is necessary to properly set the mixture ratio of the gas for supply of Si with the dilution gas, the pressure of the gas in the reaction vessel, the discharge power, and the temperature of the substrate.

The optimum range of flow rate of $H_2$ and/or the inert gas such as He as a dilution gas is properly selected according to the design of the layer, and $H_2$ and/or the optimum flow rate of inert gas such as He is normally in the range of 1 to 20 times, preferably in the range of 3 to 15 times, and most preferably in the range of 5 to 10 times the gas for supply of Si.

The optimum range of the gas pressure in the reaction vessel is also properly selected according to the design of the layer, and the pressure is normally in the range of $1.3 \times 10^{-2}$ to $1.3 \times 10^3$ Pa, preferably in the range of $6.7 \times 10^{-2}$ to $6.7 \times 10^2$ Pa, and most preferably in the range of $1.3 \times 10^{-1}$ to $1.3 \times 10^2$ Pa.

The desired numerical ranges of the mixture ratio of the dilution gas, the gas pressure, the discharge power, and the substrate temperature for forming the charge injection inhibiting layer 504 can be the aforementioned ranges, but these layer production factors, normally, cannot be determined independent of each other. Therefore, it is desirable to determine the optimum value of each layer production factor, based on their relationship so as to form the inhibiting layer having the desired characteristics.

For the purpose of further enhancing the adhesion between the cylindrical substrate 501 and the photoconductive layer 502 or the charge injection inhibiting layer 504, the photosensitive member may be provided with an adhesion layer, for example, comprised of $Si_3N_4$, $SiO_2$, SiO, or an amorphous material comprising silicon atoms as the matrix and containing hydrogen atoms and/or halogen atoms and atoms selected from the group consisting of carbon atoms, oxygen atoms, and nitrogen atoms, or the like. Further, the photosensitive member may also be provided with a light absorbing layer for preventing interference patterns due to light reflected from the substrate.

EXPERIMENTS AND EXAMPLES

The present invention will be described in further detail with experiments and examples thereof, but it should be noted that the present invention is by no means intended to be limited to these examples.

(Experiment 1)

Figure 6A:
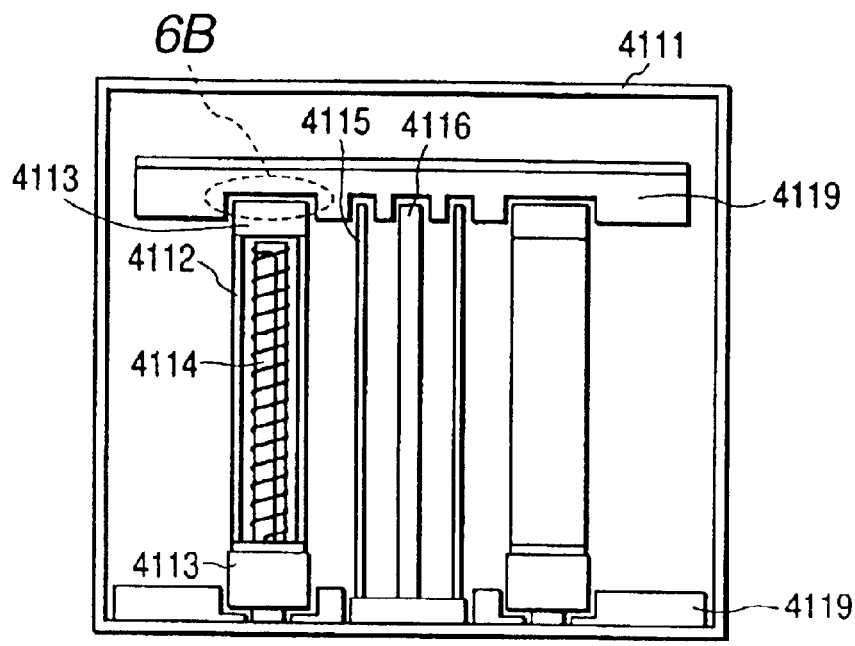
FIG. 6A is a schematic, sectional, structural view for explaining another example of the deposited film forming apparatus
Figure 6B:
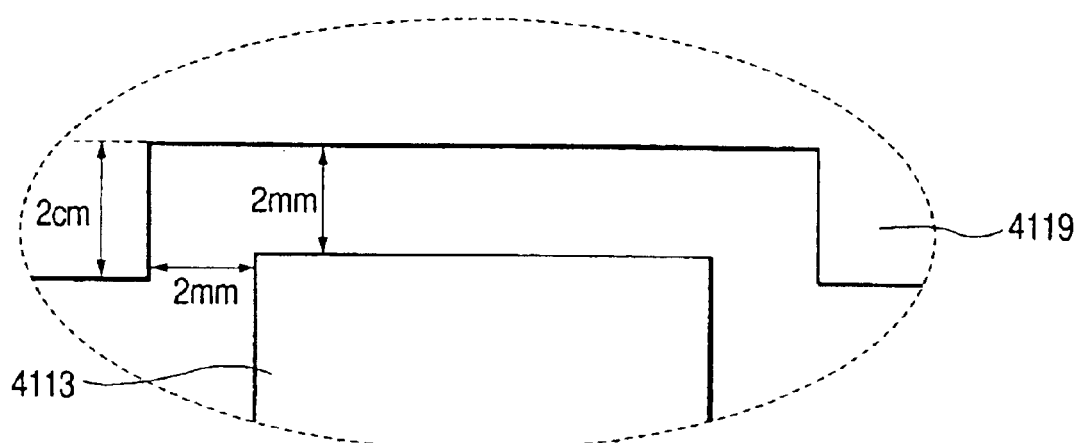
FIG. 6B is an enlarged view of part 6B of FIG. 6A.

In the deposited film forming apparatus of the present invention illustrated in FIGS. 2A and 2B where the end portions of all the gas inlet pipes, the cathode electrode, and the holding members of the cylindrical substrates were located outside the glow discharge inducing area, the stability of discharge was evaluated according to the method described below under the conditions shown in Table 1 below, on surface-mirror-finished, aluminum cylinders (cylindrical substrates) of the outside diameter of 80 mm and the length of 358 mm. The means for locating all the end portions of the gas inlet pipes, cathode electrode, and holding members of cylindrical substrates was end covering members 4119 comprised of $Al_2O_3$ and machined so that the depth of each groove was 2 cm and a clearance with respect to each end portion of the gas inlet pipes, cathode electrode, and holding members of cylindrical substrates was 2 mm, as illustrated in FIGS. 6A and 6B. The surface roughness (Rz) of the discharge-inducing-area-side surface of each end covering member 4119 was 40 μm.

TABLE 1

| Gas species and flow rates | |
| --- | --- |
| SiH₄ (sccm) | 200 |
| H₂ (sccm) | 500 |
| Inner pressure (Pa) | 6.6 |
| High-frequency power (W) | 100–2000 |
| Frequency (MHz) | 13.56–500 |

[Discharge Stability]

Variations in reflection power were monitored for 60 minutes as to discharge and the discharge stability was evaluated based on the variation state. Criteria for the discharge stability were as follows.

a: Stable without any variation b: Stable with one to three variations of reflection power/incident power ≦0.02 c: Sometimes rather unstable with three or more variations of reflection power/incident power ≦0.02 d: Unstable with one to three variations of reflection power/incident power ≧0.02 e: Sometimes considerably unstable with three or more variations of reflection power/incident power ≧0.02

The evaluation results of the discharge stability at each frequency are shown in Table 2.

As seen from Table 2, Experiment 1 showed good results at all the high-frequency powers in the frequency range of 20 MHz to 450 MHz and, particularly, very good results in the range of 50 MHz to 450 MHz.

TABLE 2

| Frequency | High-frequency power (W) | | | |
| --- | --- | --- | --- | --- |
| (MHz) | 100 | 500 | 1000 | 2000 |
| 13.56 | b | b | c | d |
| 20 | b | a | b | b |
| 40 | b | a | a | b |
| 50 | a | a | a | a |
| 80 | a | a | a | a |
| 105 | a | a | a | a |
| 200 | a | a | a | a |
| 400 | a | a | a | a |
| 450 | a | a | a | a |
| 500 | b | a | b | c |

Comparative Experiment 1

Figure 1A:
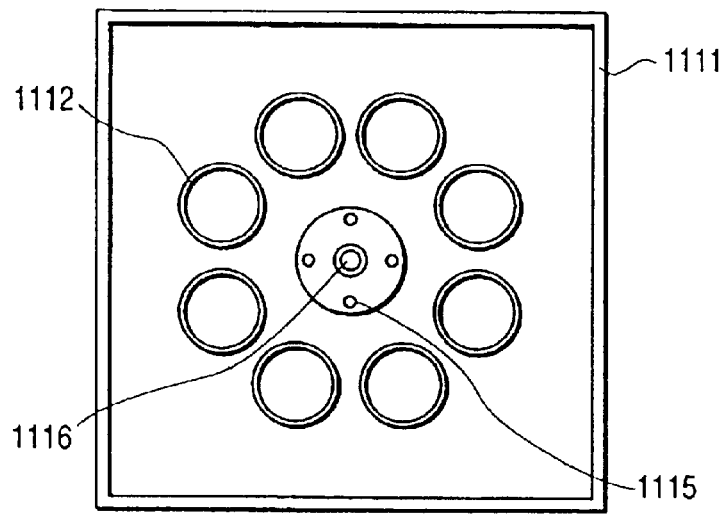
FIG. 1A and FIG. 1B are schematic, sectional, structural views for explaining an example of the deposited film forming apparatus.
Figure 1B:
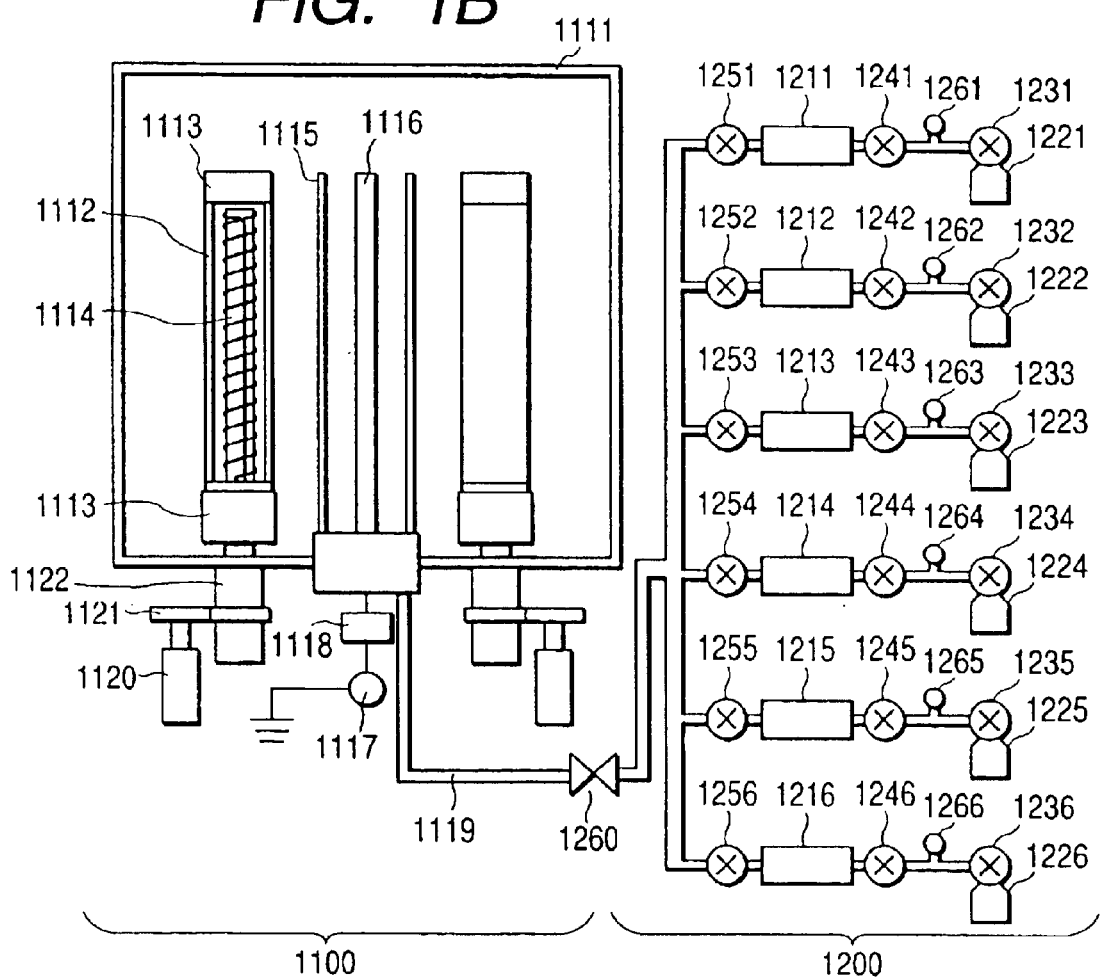

As a comparative experiment, the stability of discharge was evaluated under the conditions of Table 1 (only at the frequency of 105 MHz), in the similar fashion to Experiment 1, using the deposited film forming apparatus illustrated in FIGS. 1A and 1B where any one of the end portions of the gas inlet pipes, cathode electrode, and holding members of cylindrical substrates was not located outside the glow discharge inducing area. The results of this evaluation are shown together with those of Experiment 1 in Table 3.

It was verified that the discharge using the deposited film forming apparatus of the present invention showed very good results in all the high-frequency powers, as compared with the discharge using the apparatus of FIGS. 1A and 1B.

TABLE 3

(at frequency 105 MHz)

| High-frequency power (W) | Experiment 1 (FIGS. 2A and 2B) | Comparative Experiment 1 (FIGS. 1A and 1B) |
| --- | --- | --- |
| 100 | a | b |
| 500 | a | c |
| 1000 | a | c |
| 2000 | a | d |

EXAMPLE 1

In the deposited film forming apparatus illustrated in FIGS. 2A and 2B, the end covering numbers 4119, similar to those in Experiment Example 1 illustrated in FIGS. 6A and 6B, were set as the means for locating all the end portions of the gas inlet pipes, cathode electrode, and holding members of cylindrical substrates outside the glow discharge inducing area, and electrophotographic photosensitive members each comprised of the charge injection inhibiting layer, the photoconductive layer, and the surface layer were produced at the oscillation frequency of the high-frequency power supply of 105 MHz under the production conditionshown in Table 4, on each of surface-mirror-finished, aluminum cylinders (cylindrical substrates) having the outside diameter of 80 mm and the length of 358 mm.

TABLE 4

| | Charge injection inhibiting layer | Photo-conductive layer | Surface layer |
|---|---|---|---|
| Gas species and flow rates | | | |
| $SiH_4$ (sccm) | 200 | 200 | 20 |
| $H_2$ (sccm) | 200 | 500 | |
| $B_2H_6$ (ppm) relative to $SiH_4$ | 1000 | 1.2 | |
| $CH_4$ (sccm) | 10 | | 300 |
| Inner pressure (Pa) | 1.0 | 1.0 | 1.5 |
| High-frequency power (W) | 800 | 800 | 600 |
| Substrate temperature (° C.) | 250 | 250 | 250 |
| Thickness (μm) | 3 | 30 | 0.5 |

Comparative Example 1

Electrophotographic photosensitive member were produced under the same conditions as in Example 1, except that the deposited film forming apparatus used herein was the one illustrated in FIGS. 1A and 1B where any one of the end portions of the gas inlet pipes, cathode electrode, and holding members of cylindrical substrates was not located outside the glow discharge inducing area.

The electrophotographic photosensitive members produced in Example 1 and in Comparative Example 1 as described above were evaluated as to their chargeability, sensitivity, image density irregularities, ghost memory, and image defects. The evaluations of chargeability, sensitivity, image density irregularities, ghost memory, and image defects were carried out using a copying machine NP-6750 manufactured by CANON K.K., which was modified for these tests. The specific evaluation methods were as follows.

[Chargeability]

The dark area surface potential of each electrophotographic photosensitive member was measured by a surface electrometer when a constant current was allowed to flow in the primary charger of the copying machine. The value obtained at this time was defined as chargeability. Therefore, a larger dark area potential indicates better chargeability.

[Sensitivity]

The current of the primary charger was adjusted so that the dark area potential at the position of the developing device became a fixed value and thereafter the image exposure amount was adjusted so that the light area potential at the position of the developing device was set at a predetermined value, using the white sheet of a reflection density of not more than 0.01 as an original. The sensitivity was evaluated by the image exposure amount at that time. Therefore, a smaller image exposure amount indicates better sensitivity.

[Image Density Irregularities]

The current of the primary charger was adjusted so that the dark area potential at the position of the developing device became a fixed value and thereafter the image exposure amount was adjusted so that the light area potential at the position of the developing device was set at a predetermined value, using the white sheet of the reflection density of not more than 0.01 as an original. Then a halftone chart (part number: FY9-9042) manufactured by CANON K.K. was placed on the original plate and a copy thereof was obtained. The image density irregularities were evaluated by a difference between the maximum and the minimum values of reflection density in the entire region on the copy image. Therefore, a smaller value indicates a better result.

[Ghost Memory]

A ghost test chart (part number: FY9-9040) manufactured by CANON K.K. with black dots of the reflection density of 1.1 and the diameter of 5 mm attached thereto was placed at the image end section on the original plate and a halftone chart (part number: FY9-9042) manufactured by CANON K.K. was laid thereon to obtain a copy image. In the copy image, the difference was measured between the reflection density of black dots of the diameter 5 mm of the ghost chart and the reflection density of the halftone part, recognized on the halftone copy. Therefore, a smaller numerical value indicates a better result.

[Image Defects]

The halftone chart (part number: FY9-9042) manufactured by CANON K.K. was placed on the original plate and a copy thereof was obtained. White spots having a diameter not less than 0.1 mm were counted in the same area of the copy image obtained and the image defects were evaluated by the number of white spots. Therefore, a smaller numerical value indicates a better result.

The evaluation results are shown in Table 5. The evaluation results are given using the corresponding results of Comparative Example 1 as the basis, based on the following criteria: a represents an improvement of not less than 20%; b an improvement of not less than 10% but less than 20%; c an improvement of not less than 5% but less than 10%; d an improvement of less than 5%; e degradation. The electrophotographic photosensitive members produced by the deposited film forming apparatus of the present invention had better results as to the chargeability, image density irregularities, and image defects than those produced by the apparatus of FIGS. 1A and 1B and, particularly, had very good results as to the image density irregularities and image defects.

This verified that the present invention had the effect of improving the chargeability and suppressing the image density irregularities and image defects.

TABLE 5

(with Comparative Example 1 used as basis)

| | Example 1 |
|---|---|
| Chargeability | b |
| Sensitivity | c |
| Image density irregularities | a |
| Ghost memory | c |
| Image defects | a |

EXAMPLE 2

In the deposited film forming apparatus illustrated in FIGS. 2A and 2B, the end covering members 4119, similar to those in Experiment 1 illustrated in FIGS. 6A and 6B, were set as the means for locating all the end portions of the gas inlet pipes, cathode electrode, and holding members of cylindrical substrates outside the glow discharge inducing area, and the electrophotographic photosensitive members each comprised of the charge injection inhibiting layer, the photoconductive layer, and the surface layer were produced under the production conditions of Table 4 on each of surface-mirror-finished, aluminum cylinders (cylindrical substrates) having the outside diameter of 80 mm and the length of 358 mm. Evaluations similar to those in Example 1 were carried out. However, film formation was carried out at each of different oscillation frequencies of the high-frequency power supply ranging from 13.56 MHz to 500 MHz. The results obtained are shown in Table 6.

As seen from Table 6, the good results were obtained as to the chargeability, image density irregularities, and image defects by use of the deposited film forming apparatus of the present invention illustrated in FIGS. 2A and 2B and particularly good deposited films were obtained as to the image density irregularities and image defects. Particularly good results were obtained in the frequency range of 50 MHz to 450 MHz.

TABLE 6

| Frequency (MHz) | Charge-ability | Sensitivity | Image density irregularities | Ghost memory | Image defects |
| --- | --- | --- | --- | --- | --- |
| 13.56 | c | d | b | d | b |
| 20 | c | c | b | c | a |
| 40 | b | c | b | c | a |
| 50 | b | c | a | c | a |
| 105 | b | c | a | c | a |
| 200 | b | c | a | c | a |
| 450 | b | c | a | c | a |
| 500 | c | c | b | c | a |

EXAMPLE 3

Figure 7A:
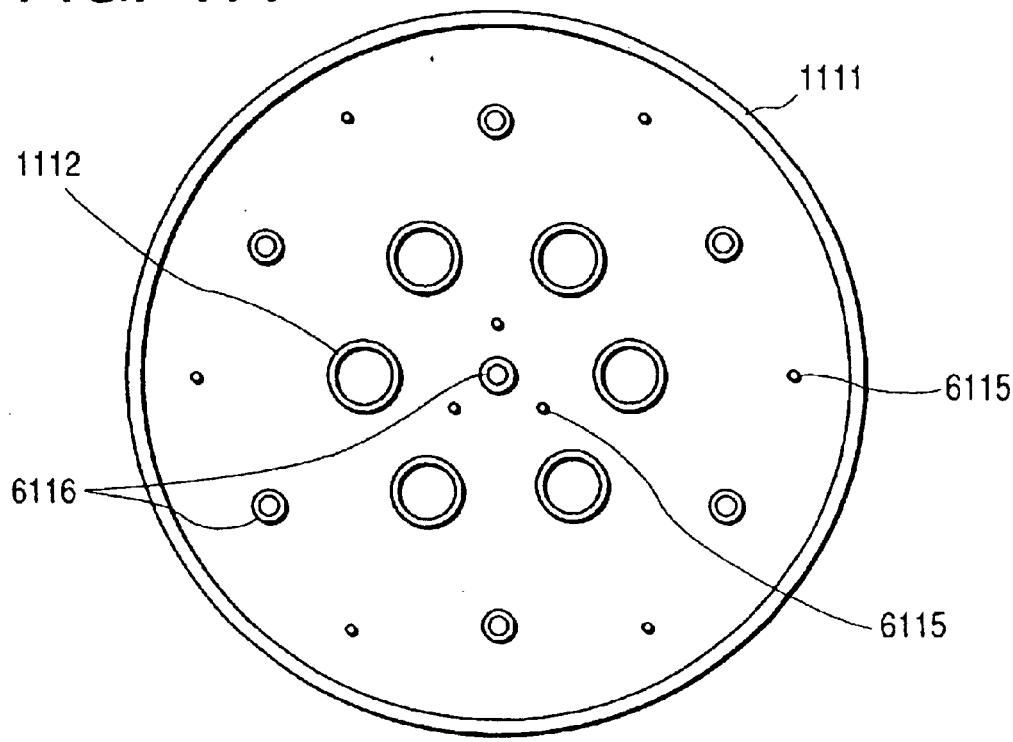
FIG. 7A and FIG. 7B are schematic, sectional, structural views for explaining still another example of the deposited film forming apparatus.
Figure 7B:
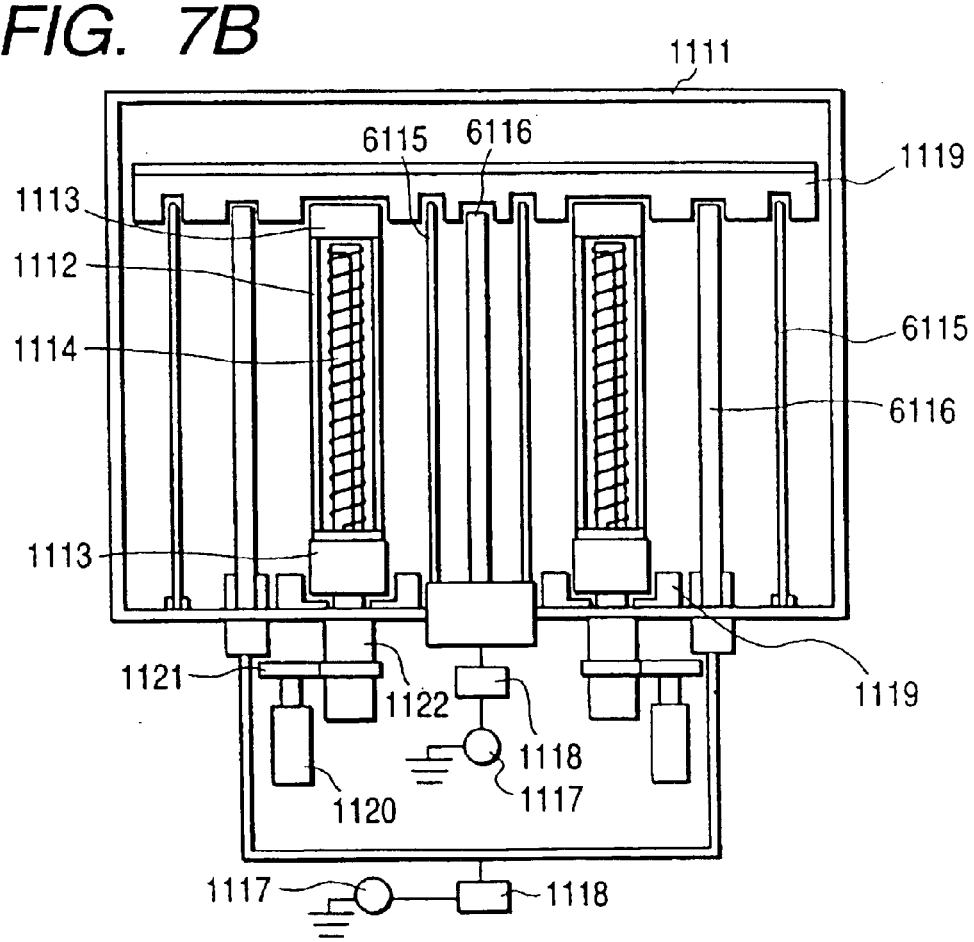

In the deposited film forming apparatus illustrated in FIGS. 7A and 7B, detachable, circular covers 1119 comprised of Al and having an alumina ($Al_2O_3$)—sprayed surface on the discharge area side were set as the means for locating all the end portions of the gas inlet pipes, cathode electrode, and holding members of cylindrical substrates outside the glow discharge inducing area, and electrophotographic photosensitive members each comprised of the charge injection inhibiting layer, the photoconductive layer, and the surface layer were produced under the production conditions shown in Table 4 at the oscillation frequency of the high-frequency power supply of 50 MHz, on each of surface-mirror-finished, aluminum cylinders (cylindrical substrates) having the outside diameter of 80 mm and the length of 358 mm.

Gas inlet pipes 6115 and cathode electrodes 6116 are not placed only within th common circumference of the holding members of cylindrical substrates illustrated in FIGS. 2A and 2B, but are also placed at equal intervals each on a common circumference outside the common circumference of the holding members.

The high-frequency power was introduced into the cathode electrode inside the common circumference of the holding members of cylindrical substrates and to the group of cathode electrodes outside the common circumference of the holding members, by separately using a high-frequency matching box 1118 and high-frequency power supply 1117 for the inside and outside. The high-frequency power was split outside the reaction vessel 1111 to be guided to the plurality of cathode electrodes outside the common circumference.

Evaluations, similar to those in Example 1, were conducted for the electrophotographic photosensitive members thus produced. The evaluation results are shown in Table 7.

As seen from Table 7, improvement was recognized in the chargeability, image density irregularities, and image defects by use of the present invention and very good results were obtained, particularly, as to the image density irregularities and image defects.

This verified that the present invention had the effect of improving the chargeability and suppressing the image density irregularities and image defects.

TABLE 7

(with Comparative Example 1 used as basis)

|  | Example 3 |
| --- | --- |
| Chargeability | b |
| Sensitivity | c |
| Image density irregularities | a |
| Ghost memory | c |
| Image defects | a |

EXAMPLE 4

Figure 8A:
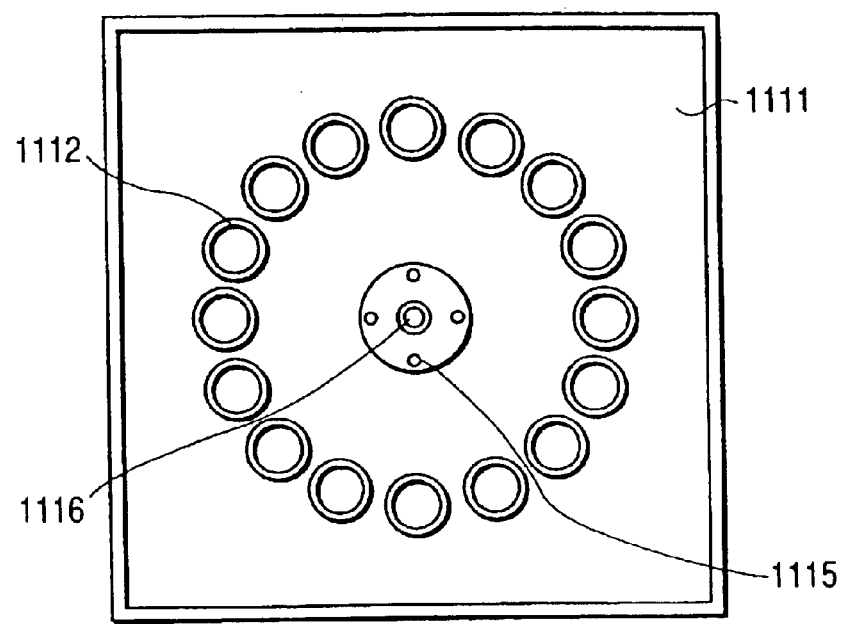
FIG. 8A and FIG. 8B are schematic, sectional, structural views for explaining still another example of the deposited film forming apparatus.
Figure 8B:
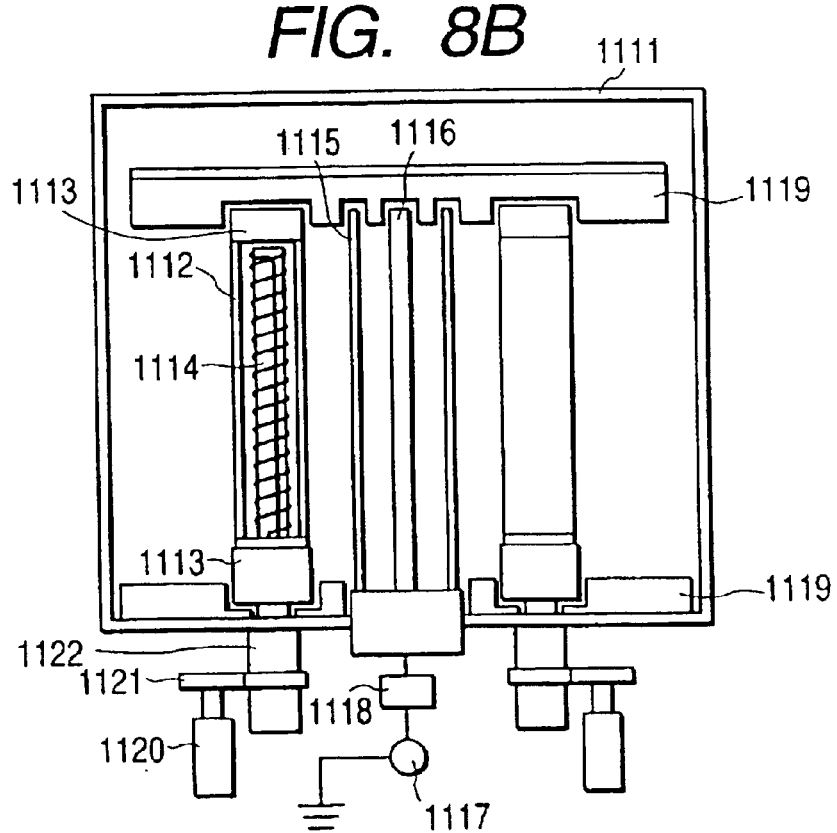

In the deposited film forming apparatus illustrated in FIGS. 8A and 8B, the end covering members 1119, similar to those in Experiment 1 illustrated in FIGS. 6A and 6B except that they were made to be adapted to the outside diameter of the cylindrical substrates of 30 mm, were set as the means for locating all the end portions of the gas inlet pipes, cathode electrode, and holding members of cylindrical substrates outside the glow discharge inducing area. The electrophotographic photosensitive members each comprised of the charge injection inhibiting layer, the photoconductive layer, and the surface layer were produced under the production conditions shown in Table 8 at the oscillation frequency of the high-frequency power supply of 200 MHz on each of surface-mirror-finished, aluminum cylinders (cylindrical substrates) having the outside diameter of 30 mm and the length of 358 mm.

TABLE 8

|  | Charge injection inhibiting layer | Photo-conductive layer | Surface layer |
| --- | --- | --- | --- |
| Gas species and flow rates |  |  |  |
| $SiH_4$ (sccm) | 250 | 250 | 20 |
| $H_2$ (sccm) | 0 | 0 |  |
| $B_2H_6$ (ppm) relative to $SiH_4$ | 500 | 1.0 |  |
| NO (sccm) | 10 | 0 |  |
| $CH_4$ (sccm) | 0 | 0 | 400 |
| Inner pressure (Pa) | 1.3 | 1.3 | 1.0 |
| High-frequency power (W) | 1000 | 1000 | 500 |
| Substrate temperature (° C.) | 250 | 250 | 240 |
| Thickness ($\mu$m) | 3 | 30 | 0.6 |

Comparative Example 2

In the deposited film forming apparatus illustrated in FIGS. 8A and 8B, the electrophotographic photosensitive members were produced under the similar conditions to those in Example 4 by the apparatus structure without the end covering members 1119.

Each of the electrophotographic photosensitive members produced in Example 4 and in Comparative Example 2 as described above was set in a copying machine NP-6030 manufactured by CANON K.K., which was modified for the tests and the evaluations, similar to those in Example 1. The evaluation was carried out as to the chargeability, sensitivity, image density irregularities, ghost memory and image defects. The evaluation results are given using the corresponding results of Comparative Example 2 as the basis. The results are shown in Table 9.

As seen from Table 9, there was an improvement in the chargeability, image density irregularities, and image defects. Very good results were obtained particularly as to the image density irregularities and image defects.

This verified that the present invention had the effect of improving the chargeability and suppressing the image density irregularities and image defects.

TABLE 9

(with Comparative Example 2 used as basis)

|  | Example 4 |
|---|---|
| Chargeability | b |
| Sensitivity | c |
| Image density irregularities | a |
| Ghost memory | c |
| Image defects | a |

In the present invention, as described above, each end portion is located outside the region of glow discharge in forming a deposited film by covering each end portion of the holding members of cylindrical substrates, the source gas supply means, and the power supply means in the reaction vessel, whereby the present invention can enhance the stability of the plasma during the formation of the deposited film, greatly decrease peeling off of film, which could cause image defects, and stably form the deposited film with excellent uniformity of the thickness and film characteristics. The present invention can also be applied to the variety of electrophotographic photosensitive members and permits low-cost and easy mass production thereof.

What is claimed is:

1. A film forming method employing a reaction vessel capable of hermetic evacuation, a substrate holding member having a first end portion for holding a substrate in the reaction vessel, a source gas supply means having a second end portion for supplying a source gas, a glow discharge region and a power supply means having a third end portion for introducing a high-frequency power comprising: inducing a glow discharge by the high-frequency power to decompose the source gas introduced into the reaction vessel, thereby forming the deposited film on the substrate held by the substrate holding member, while covering the end portion of each of the substrate holding member, the source gas supply means, and the power supply means with a covering member spaced apart from each of said end portions to prevent glow discharge from occurring between each of the end portions and the covering member.

2. The film forming method according to claim 1, wherein covering the end portions is effected by an end covering member which is detachable from the reaction vessel.

3. The film forming method according to claim 1, wherein the frequency of the high-frequency power is in the range of 50 MHz to 450 MHz.

* * * * *